(12) United States Patent
Nakamura

(10) Patent No.: US 9,709,715 B2
(45) Date of Patent: *Jul. 18, 2017

(54) SPECTROSCOPIC SENSOR AND ANGLE LIMITING FILTER

(71) Applicant: SEIKO EPSON CORPORATION, Tokyo (JP)

(72) Inventor: Noriyuki Nakamura, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/855,972

(22) Filed: Sep. 16, 2015

(65) Prior Publication Data

US 2016/0003991 A1    Jan. 7, 2016

Related U.S. Application Data

(63) Continuation of application No. 13/413,949, filed on Mar. 7, 2012, now Pat. No. 9,163,984.

(30) Foreign Application Priority Data

Mar. 17, 2011  (JP) ................................. 2011-059232
Jan. 27, 2012  (JP) ................................. 2012-015047

(51) Int. Cl.
    *H01L 29/78*    (2006.01)
    *G02B 5/20*     (2006.01)
    (Continued)

(52) U.S. Cl.
    CPC .............. *G02B 5/20* (2013.01); *G01J 3/0205* (2013.01); *G01J 3/0256* (2013.01);
    (Continued)

(58) Field of Classification Search
    None
    See application file for complete search history.

(56) References Cited

U.S. PATENT DOCUMENTS

5,336,919 A    8/1994   Toriyama
8,710,606 B2   4/2014   Uematsu et al.
(Continued)

FOREIGN PATENT DOCUMENTS

JP    H04-196167 A    7/1992
JP    H06-129908 A    5/1994
(Continued)

OTHER PUBLICATIONS

Jun. 22, 2015 Office Action issued in U.S. Appl. No. 13/413,949.

*Primary Examiner* — Jack Chen
(74) *Attorney, Agent, or Firm* — Oliff PLC

(57) ABSTRACT

An angle limiting filter includes: a first light-shielding layer containing a first light-shielding material and provided with a first opening; a second light-shielding layer containing a second light-shielding material and located in a region which surrounds at least one portion of the first light-shielding layer; a third light-shielding layer containing the first light-shielding material, provided with a second opening at least one portion of which overlaps the first opening, and located above the first light-shielding layer; and a fourth light-shielding layer containing the second light-shielding material and located above the second light-shielding layer in a region which surrounds at least one portion of the third light-shielding layer.

8 Claims, 8 Drawing Sheets

(51) Int. Cl.
*G01J 3/02* (2006.01)
*G01J 3/36* (2006.01)
*G01J 3/28* (2006.01)
*H01L 27/146* (2006.01)
*G01J 3/12* (2006.01)

(52) U.S. Cl.
CPC ............. *G01J 3/0289* (2013.01); *G01J 3/28* (2013.01); *G01J 3/36* (2013.01); *H01L 27/1462* (2013.01); *H01L 27/14623* (2013.01); *G01J 2003/1226* (2013.01)

(56) References Cited

U.S. PATENT DOCUMENTS

| | | |
|---|---|---|
| 8,976,357 B2 | 3/2015 | Uematsu et al. |
| 9,163,984 B2 * | 10/2015 | Nakamura ............ G01J 3/0256 |
| 2008/0237759 A1 | 10/2008 | Hasegawa |
| 2011/0215432 A1 | 9/2011 | Uematsu et al. |
| 2011/0216315 A1 * | 9/2011 | Uematsu ................. G01J 3/02 356/326 |
| 2011/0233388 A1 | 9/2011 | Nakamura |
| 2011/0233703 A1 | 9/2011 | Nakamura |
| 2011/0244190 A1 | 10/2011 | Yoshizawa |
| 2012/0208130 A1 | 8/2012 | Yoshizawa |
| 2012/0235269 A1 | 9/2012 | Uematsu et al. |
| 2012/0236297 A1 | 9/2012 | Uematsu et al. |

FOREIGN PATENT DOCUMENTS

| | | |
|---|---|---|
| JP | 2000-031510 A | 1/2000 |
| JP | 2001-267544 A | 9/2001 |
| JP | 2005-294647 A | 10/2005 |
| JP | 2007-129192 A | 5/2007 |
| JP | 2008-244269 A | 10/2008 |
| JP | 2011-185634 A | 9/2011 |
| JP | 2011-203247 A | 10/2011 |
| JP | 2011-205088 A | 10/2011 |
| JP | 2011-209395 A | 10/2011 |
| JP | 2011-210807 A | 10/2011 |
| JP | 2011-218453 A | 11/2011 |

* cited by examiner

SPECTROSCOPIC SENSOR AND ANGLE LIMITING FILTER

This application is a continuation application of U.S. patent application Ser. No. 13/413,949, filed Mar. 7, 2012, which claims priority to Japanese Patent Application No. 2011-059232, filed Mar. 17, 2011, and Japanese Patent Application No. 2012-015047, filed Jan. 27, 2012, the entire disclosures of which are expressly incorporated by reference herein.

BACKGROUND

1. Technical Field

The present invention relates to a spectroscopic sensor and an angle limiting filter.

2. Related Art

In the fields of medical care, agriculture, environment, and so on, spectroscopic sensors are used for diagnosing and inspecting objects. For example, in the field of medical care, a pulse oximeter is used to measure the blood oxygen saturation level using light absorption by hemoglobin. In the field of agriculture, a saccharometer is used to measure the sugar content of fruits using light absorption by sugar.

JP-A-6-129908 discloses a spectroscopic imaging sensor which limits the incident angle with an optical fiber optically connecting between an interference filter and a photoelectric conversion element to thereby limit the transmission wavelength band to the photoelectric conversion element.

However, a related-art spectroscopic sensor has a problem that it is difficult to reduce the size thereof. Therefore, it is difficult to install a number of sensors at desired places or constantly install sensors.

SUMMARY

An advantage of some aspects of the invention relates to a reduction in the size of a spectroscopic sensor and an angle limiting filter.

In some aspects of the invention, an angle limiting filter includes: a first light-shielding layer containing a first light-shielding material and provided with a first opening; a second light-shielding layer containing a second light-shielding material and located in a region which surrounds at least one portion of the first light-shielding layer; a third light-shielding layer containing the first light-shielding material, the third light-shielding layer being provided with a second opening at least one portion of which overlaps the first opening, the third light-shielding layer being located above the first light-shielding layer; and a fourth light-shielding layer containing the second light-shielding material and located above the second light-shielding layer in a region which surrounds at least one portion of the third light-shielding layer.

According to the aspect, an optical path is formed by the light shielding layers, whereby a minute pattern can be formed, and the angle limiting filter reduced in size can be manufactured. Moreover, in the region surrounding the first light-shielding layer and the region surrounding the third light-shielding layer, the second light-shielding layer and the fourth light-shielding layer are provided, respectively. Therefore, the angle limiting filter having high surface planarity can be manufactured.

In the aspect, it is desirable that the first light-shielding layer is in contact with an edge surface of the second light-shielding layer, and that the third light-shielding layer is in contact with an edge surface of the fourth light-shielding layer.

According to this configuration, it is possible to prevent light from passing between the first light-shielding layer and the second light-shielding layer, and between the third light-shielding layer and the fourth light-shielding layer. Moreover, when these light-shielding layers are conductors, electrical conductivity can be obtained between these light-shielding layers.

In the aspect, it is desirable that the first light-shielding layer is provided with a plurality of the first openings, and includes a first portion located between two of the first openings next to each other and a second portion located closer to the side of the second light-shielding layer than the first portion and the plurality of first openings, and that the edge surface of the second light-shielding layer is located at the center of the width of the second portion of the first light-shielding layer, and covered with the first light-shielding layer.

According to this configuration, since the edge surface of the second light-shielding layer is located at the center of the width of the second portion of the first light-shielding layer, it is possible to prevent the second light-shielding layer from exposing in the optical path. Moreover, when these light-shielding layers are conductors, electrical conductivity can be obtained more reliably between these light-shielding layers.

In the aspect, a gap may be disposed between the first light-shielding layer and the third light-shielding layer, and both the first light-shielding layer and the third light-shielding layer may be in contact with a portion of the fourth light-shielding layer.

According to this configuration, even when a gap is disposed between the first light-shielding layer and a third light-shielding layer, electrical conductivity can be obtained with the forth light-shielding layer intervening therebetween.

In the aspect, it is desirable that the reflectance of the first light-shielding material is lower than that of the second light-shielding material.

Moreover, it is desirable that the first and third light-shielding layers are configured with a material whose reflectance is lower than that of aluminum.

According to this configuration, the light shielding layers are configured with a substance having a low light reflectance, whereby it is possible to reduce light incident on a wall surface of the optical path to pass through the optical path. Accordingly, even with the angle limiting filter reduced in size, it is possible to make it difficult for light having an incident angle exceeding the limited angular range to pass through the optical path.

In another aspect of the invention, a spectroscopic sensor includes: the angle limiting filter described above; a wavelength limiting filter which limits the wavelength of light capable of passing through the angle limiting filter; and a light receiving element which detects light passed through the angle limiting filter and the wavelength limiting filter.

According to the aspect, since the angle limiting filter described above is used, the spectroscopic sensor reduced in size can be manufactured. Moreover, even when an inclined structure for inclining the wavelength limiting filter is not formed, the wavelength of transmitted light can be selected by inclining the optical path of the angle limiting filter.

The term "above" used herein means a direction opposite to a direction toward a rear surface of a substrate with a surface thereof being as the standard.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail. The embodiments described below do not unduly limit the contents of the invention set forth in the appended claims. Moreover, not all of the configurations described in the embodiments may necessarily be indispensable as solving means of the invention. The same constituent elements are denoted by the same reference and numeral signs, and the description thereof is omitted.

1. First Embodiment

Figure 1A:
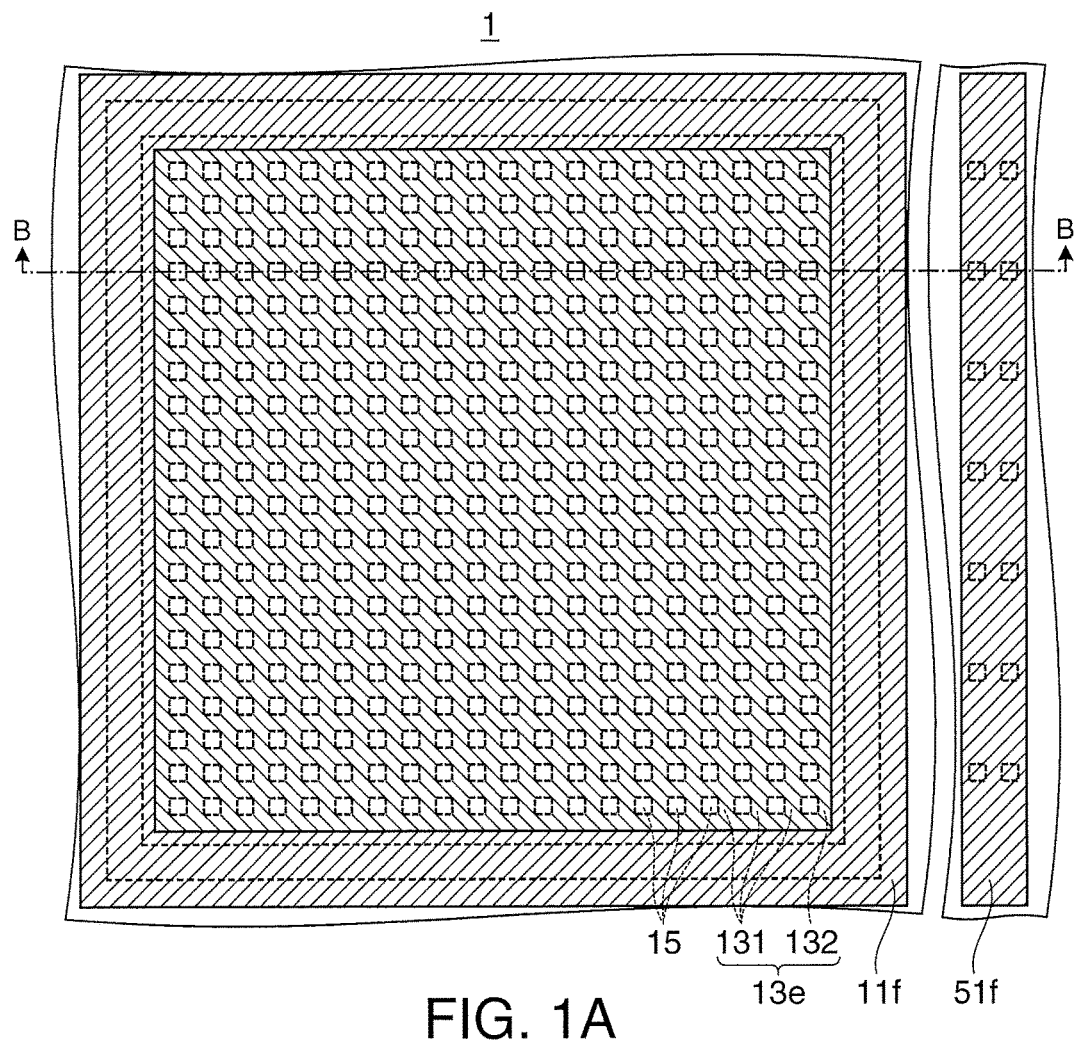
FIGS. 1A and 1B show an angle limiting filter and a spectroscopic sensor according to a first embodiment.
Figure 1B:
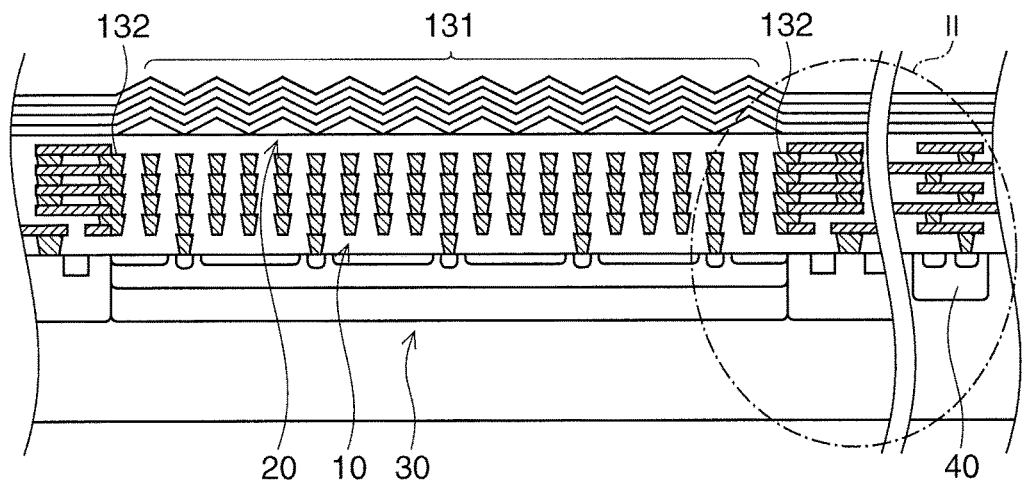
Figure 2:
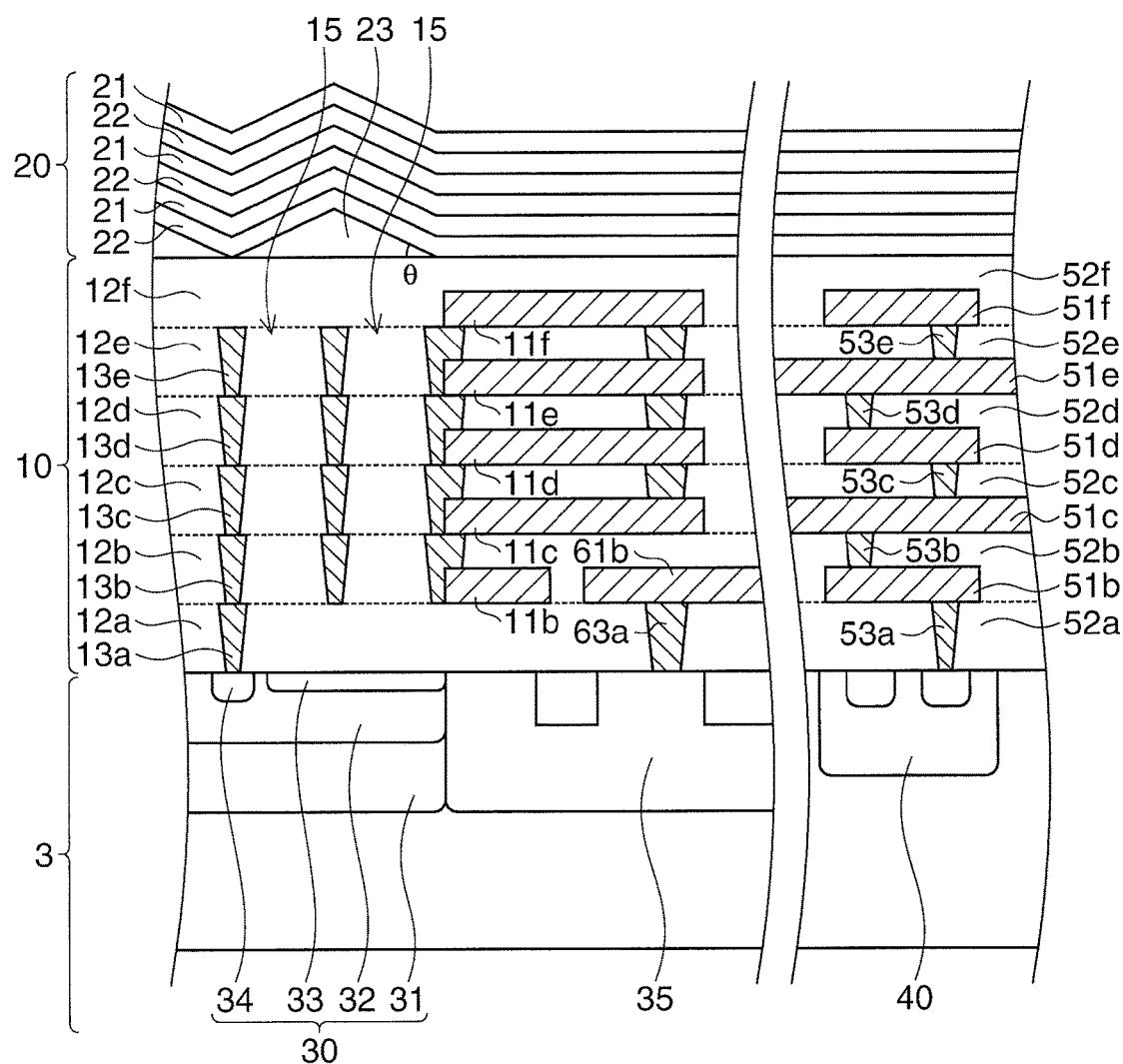
FIG. 2 is a cross-sectional view showing the angle limiting filter and the spectroscopic sensor according to the first embodiment.

FIGS. 1A and 1B are schematic views showing an angle limiting filter and a spectroscopic sensor according to a first embodiment of the invention. FIG. 1A is a plan view of the spectroscopic sensor. FIG. 1B is a cross-sectional view taken along line B-B of FIG. 1A. FIG. 2 is a cross-sectional view showing the angle limiting filter and the spectroscopic sensor according to the first embodiment. FIG. 2 corresponds to an enlarged view of a portion of surrounding line II shown in FIG. 1B.

The spectroscopic sensor 1 includes the angle limiting filter 10, a wavelength limiting filter 20, and a light receiving element 30 (refer to FIG. 1B). In FIG. 1A, the wavelength limiting filter 20 is not illustrated.

In a P-type silicon substrate 3 (refer to FIG. 2) as a semiconductor substrate on which the spectroscopic sensor 1 is formed, an electronic circuit including semiconductor elements 40 which apply a predetermined reverse bias voltage to the light receiving element 30, or detect a current based on a photoelectromotive force generated in the light receiving element 30 and amplify an analog signal corresponding to the magnitude of the current to convert the analog signal into a digital signal is formed. Any of a plurality of aluminum (Al) alloy layers 51b to 51f for wiring is connected to the semiconductor element 40, whereby an electrical connection between the semiconductor elements in the electronic circuit or an electrical connection of the electronic circuit with the outside is performed.

Silicon oxide layers 52b to 52e are formed between the plurality of aluminum alloy layers 51b to 51f. A silicon oxide layer 52a is formed between the lowermost aluminum alloy layer 51b and the semiconductor element 40. Conductive plugs 53a to 53e respectively connect between the aluminum alloy layers 51b to 51f, and between the lowermost aluminum alloy layer 51b and the semiconductor element 40. The conductive plugs 53a to 53e electrically connect respectively, at the places where the conductive plugs 53a to 53e are arranged, between the aluminum alloy layers 51b to 51f in the vertical direction, and between the lowermost aluminum alloy layer 51b and the semiconductor element 40. On upper and lower surfaces of each of the aluminum alloy layers 51b to 51f, a titanium nitride (TiN) film may be formed for enhancing the electrical connection with the conductive plugs 53a to 53e.

1-1. Angle Limiting Filter

The angle limiting filter 10 is formed on the P-type silicon substrate 3 in which the light receiving element 30 is formed. In the angle limiting filter 10 of the embodiment, a wall portion defining an optical path is formed by tungsten (W) layers 13b to 13e as a plurality of light shielding layers (first, third, and fifth light-shielding layers). Each of the tungsten layers 13b to 13e has at least one opening 15. The first, third, and fifth light-shielding layers are not limited to the tungsten layers 13b to 13e. The first, third, and fifth light-shielding layers may be formed of a substance which has a reflectance of light at wavelength to be received by the light receiving element 30 lower than that of aluminum and does not substantially transmit the light at a wavelength to be received by the light receiving element 30, for example, copper, titanium nitride, titanium tungsten, titanium, tantalum, tantalum nitride, chromium, or molybdenum.

Aluminum alloy layers 11b to 11f as a plurality of light shielding layers (second, fourth, and sixth light-shielding layers) are stacked above the P-type silicon substrate 3 via silicon oxide (SiO$_2$) layers 12b to 12e each as an insulating layer having a light transmissive property (with respect to light at a wavelength to be received by the light receiving element 30, hereinafter the same). The second, fourth, and sixth light-shielding layers are not limited to the aluminum alloy layers 11b to 11f, but copper (Cu) alloy layers may be formed.

The tungsten layers 13b to 13e are continuously formed over a plurality of layers in, for example, a lattice-shaped predetermined pattern above the P-type silicon substrate 3. With this configuration, the opening 15 formed in each of the tungsten layers 13b to 13e overlaps with one another. In regions corresponding to the openings 15 of the tungsten layers 13b to 13e, silicon oxide layers 12b to 12e each having a light transmissive property as described above are filled. With the opening 15 formed in each of the tungsten layers 13b to 13e, an optical path along the stacked direction of the tungsten layers 13b to 13e is formed.

The wall portion formed by the tungsten layers 13b to 13e limits the incident angle of light passing through the optical path. That is, when light entering the optical path is inclined with respect to the direction of the optical path, the light is incident on any of the tungsten layers 13b to 13e. A portion of the light is absorbed by any of the tungsten layers 13b to 13e, while the remaining light is reflected. Since the reflected light is weakened by repetitive reflections during its passing through the optical path, light capable of passing through the angle limiting filter 10 is substantially limited to light whose inclination with respect to the optical path is within a predetermined limited angular range.

In the aspect described above, the wall portion is formed by forming the plurality of tungsten layers 13b to 13e with a lattice-shaped predetermined pattern above the P-type silicon substrate 3. Therefore, a minute pattern can be formed, and the angle limiting filter 10 reduced in size can be manufactured. Moreover, compared to the case where a spectroscopic sensor is configured by bonding members together via an adhesive, the manufacturing process can be simplified, and a reduction in transmitted light due to an adhesive can be suppressed.

In a preferred aspect, the aluminum alloy layers 11b to 11f are configured with the same material as that of the aluminum alloy layers 51b to 51f above the electronic circuit including the semiconductor element 40, and formed by the same multilayer wiring process as that of the aluminum alloy layers 51b to 51f. The tungsten layers 13b to 13e are configured with the same material (tungsten) as that of the conductive plugs 53b to 53e above the electronic circuit, and formed by the same multilayer wiring process as that of the conductive plugs 53b to 53e. With this configuration, the angle limiting filter 10 can be formed by a semiconductor process simultaneously with the formation of the aluminum alloy layers 51b to 51f for wiring, or the conductive plugs 53b to 53e, for the electronic circuit formed on the identical P-type silicon substrate 3.

In the angle limiting filter 10 of the embodiment, the aluminum alloy layers 11b to 11f are formed in a region surrounding the wall portion formed of the tungsten layers 13b to 13e (refer to FIG. 1A). Moreover, the wall surface of the optical path of the angle limiting filter 10 is formed, not of the aluminum alloy layers 11b to 11f having a high light reflectance, but only of the tungsten layers 13b to 13e (refer to FIG. 2). With this configuration, it is possible to prevent the light entering the optical path from being reflected by the wall surface of the optical path, which can make it difficult for light having an incident angle exceeding the limited angular range to pass through the optical path. In forming the aluminum alloy layer in the region surrounding the wall portion, the aluminum alloy layer may not surround the wall portion entirely, but may have a gap.

Moreover, in a preferred aspect, the tungsten layers 13b to 13e are electrically connected to the aluminum alloy layers 11b to 11e, respectively, via inner edge surfaces of the aluminum alloy layers 11b to 11e. Then, for example, the light receiving element 30 formed in the P-type silicon substrate 3 and the tungsten layer 13b are electrically connected with a lowermost tungsten layer 13a. With this configuration, the light receiving element 30 and the aluminum alloy layers 11b to 11f are electrically connected.

In the tungsten layers 13b to 13e, the width of a portion (first portion) 131 located between two openings 15 next to each other is narrow, while the width of an outer portion (second portion) 132 is wide. At the center of the width of the outer portion 132, the inner edge surfaces of the aluminum alloy layers 11b to 11e are located. With this configuration, it is more reliably possible to realize both the electrical connection between the tungsten layers 13b to 13e and the aluminum alloy layers 11b to 11e, and the prevention of the aluminum alloy layers 11b to 11e from being exposed in the optical path of the angle limiting filter 10.

Moreover, since the inner edge surfaces of the aluminum alloy layers 11b to 11e are in contact with the tungsten layers 13b to 13e, it is possible to prevent stray light from the outside of the tungsten layers 13b to 13e (light passing between the tungsten layers 13b to 13e and the aluminum alloy layers 11b to 11e) from reaching the light receiving element 30.

In the embodiment, the angle limiting filter 10 has the optical path in a direction perpendicular to the P-type silicon substrate 3. However, the optical path is not limited to this. The angle limiting filter 10 may have an optical path in a direction inclined to the P-type silicon substrate 3. For forming the optical path in the direction inclined to the P-type silicon substrate 3, for example, the plurality of tungsten layers 13b to 13e are formed while each of the tungsten layers is shifted in the plane direction by a predetermined amount.

1-2. Wavelength Limiting Filter

The wavelength limiting filter 20 is formed by stacking, for example, on the angle limiting filter 10, a number of thin films 21 with a low refractive index, such as of silicon oxide ($SiO_2$), and a number of thin films 22 with a high refractive index, such as of titanium oxide ($TiO_2$).

Each of the low refractive index thin film 21 and the high refractive index thin film 22 has, for example, a predetermined film thickness of the order of submicron. These low refractive index thin film 21 and high refractive index thin film 22 are stacked in, for example, about 60 layers in total so that the total thickness is, for example, about 6 μm.

Each of the low refractive index thin film 21 and the high refractive index thin film 22 may be slightly inclined to the P-type silicon substrate 3. An inclination angle θ (refer to FIG. 2) of the low refractive index thin film 21 and the high refractive index thin film 22 with respect to the P-type silicon substrate 3 is set to, for example, from 0 [deg] to 30 [deg] according to a set wavelength of light to be received by the light receiving element 30.

For inclining the low refractive index thin film 21 and the high refractive index thin film 22 with respect to the P-type silicon substrate 3, for example, an inclined structure 23 having a light transmissive property is formed on the angle limiting filter 10, and the low refractive index thin film 21 and the high refractive index thin film 22 are deposited on the inclined structure 23. The inclined structure 23 is formed by, for example, processing silicon oxide formed on the angle limiting filter 10 by a CMP (chemical mechanical polishing) method.

By forming the inclined structure 23 having the inclination angle θ according to a set wavelength of light to be received by the light receiving element 30, the inclination angle of the low refractive index thin film 21 and the high refractive index thin film 22 with respect to the P-type silicon substrate 3 can be adjusted.

With the configuration described above, the wavelength limiting filter 20 limits the wavelength of light (light capable of passing through the angle limiting filter 10) entering the angle limiting filter 10 within the predetermined limited angular range.

That is, a portion of the incident light entering the wavelength limiting filter 20 becomes reflected light at the boundary surface between the low refractive index thin film 21 and the high refractive index thin film 22, while a portion of the incident light becomes transmitted light. Then, a portion of the reflected light is reflected again at another boundary surface between the low refractive index thin film 21 and the high refractive index thin film 22 to be combined with the transmitted light described above. In this case, light at a wavelength coincident with the optical path length of the reflected light is strengthened because the phases of the reflected light and the transmitted light coincident with each other, while light at a wavelength not coincident with the optical path length of the reflected light is weakened (interferes) because the phases of the reflected light and the transmitted light do not coincident with each other.

Here, the optical path length of reflected light is determined by the inclination angle of the low refractive index thin film 21 and the high refractive index thin film 22 with respect to the direction of incident light. Accordingly, when the interference action described above is repeated in the low refractive index thin films 21 and the high refractive index thin films 22 formed in, for example, 60 layers in total, only light at a specific wavelength transmits through the wavelength limiting filter 20 according to the incident angle of incident light, and exits from the wavelength limiting filter 20 at a predetermined exiting angle (for example, the same angle as the incident angle to the wavelength limiting filter 20).

The angle limiting filter 10 allows only light entering the angle limiting filter 10 within the predetermined limited angular range to pass therethrough. Accordingly, the wavelength of light passing through the wavelength limiting filter 20 and the angle limiting filter 10 is limited to a wavelength in a predetermined range determined by the inclination angle θ of the low refractive index thin film 21 and the high refractive index thin film 22 with respect to the P-type silicon substrate 3 and the limited angular range of incident light which the angle limiting filter 10 allows to pass therethrough.

The wavelength limiting filter is not limited to the example described above, but may be a material which transmits light at a wavelength in a specific range. Moreover, the wavelength limiting filter may be a prism which separates light at a wavelength in a specific range.

1-3. Light Receiving Element

The light receiving element 30 is an element which receives light passed through the wavelength limiting filter 20 and the angle limiting filter 10, and converts the light into a photoelectromotive force.

The light receiving element 30 includes various types of semiconductor regions formed in the P-type silicon substrate 3 by ion injection or the like. The semiconductor regions formed in the P-type silicon substrate 3 include, for example, a first-conductivity-type first semiconductor region 31, a second-conductivity-type second semiconductor region 32 formed on the first semiconductor region 31, a first-conductivity-type third semiconductor region 33 formed on the second semiconductor region 32, and a second-conductivity-type fourth semiconductor region 34 formed on the second semiconductor region 32 so as to be surrounded by the third semiconductor region 33 and containing a higher concentration of impurity than the second semiconductor region 32. The first conductivity type is, for example, N type, and the second conductivity type is, for example, P type.

The first semiconductor region 31 and the third semiconductor region 33 are electrically connected via a first-conductivity-type fifth semiconductor region 35. The first semiconductor region 31 is connected to a conductive plug 63a via the fifth semiconductor region 35. The conductive plug 63a is connected to a first external electrode (not shown) via an aluminum alloy layer 61b separated from the aluminum alloy layer 11b. The fourth semiconductor region 34 is connected to the tungsten layer 13a at the lower edge of the angle limiting filter 10, and the angle limiting filter 10 is further connected to a second external electrode (not shown) via the aluminum alloy layers 11b to 11f. With the first external electrode and the second external electrode, a reverse bias voltage can be applied to a PN junction formed between the first semiconductor region 31 and the second semiconductor region 32.

In the aspect described above, since the fourth semiconductor region 34 is connected to the second external electrode via the angle limiting filter 10, it is no necessary to dispose a conductor for wiring, other than the angle limiting filter 10, on the light receiving element 30. Therefore, it is possible to reduce a reduction in the amount of light received due to increased wiring.

When light passed through the angle limiting filter 10 is received by the light receiving element 30, a photoelectromotive force is generated at the PN junction formed between the first semiconductor region 31 and the second semiconductor region 32, thereby generating a current. The current is detected by the electronic circuit (including the semiconductor element 40) connected to the second external electrode, whereby the light received by the light receiving element 30 can be detected.

1-4. Manufacturing Method of First Embodiment

Here, a manufacturing method of the spectroscopic sensor 1 according to the first embodiment will be described. The spectroscopic sensor 1 is manufactured as follows: first, the light receiving element 30 is formed in the P-type silicon substrate 3; next, the angle limiting filter 10 is formed on the light receiving element 30; and then, the wavelength limiting filter 20 is formed on the angle limiting filter 10.

First, the light receiving element 30 is formed in the P-type silicon substrate 3. For example, ion injection or the like is first performed on the P-type silicon substrate 3 to form the N-type first semiconductor region 31. Then, ion injection or the like is further performed on the first semiconductor region 31 to form the N-type fifth semiconductor region 35 and the P-type second semiconductor region 32. Then, ion injection or the like is further performed on the second semiconductor region 32 to form the P-type fourth semiconductor region 34 and the N-type third semiconductor region 33. This process can be performed simultaneously with the formation of the electronic circuit including the semiconductor element 40 formed on the identical P-type silicon substrate 3.

Next, the angle limiting filter 10 is formed on the light receiving element 30.

FIGS. 3A to 3E are cross-sectional views showing the forming process of the angle limiting filter according to the first embodiment. In FIGS. 3A to 3E, the illustration of the P-type silicon substrate 3 is omitted.

(1) First, a silicon oxide layer 12a is formed on the P-type silicon substrate 3 in which the light receiving element 30 is formed. Next, a portion (region above the fourth semiconductor region 34) of the silicon oxide layer 12a is etched to thereby form a groove in the silicon oxide layer 12a.

Figure 3A:
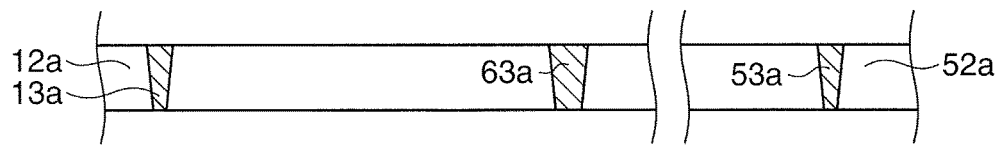
FIGS. 3A to 3E are cross-sectional views showing the forming process of the angle limiting filter according to the first embodiment.

Next, the tungsten layer 13a is embedded in the groove formed in the silicon oxide layer 12a. The tungsten layer 13a is formed simultaneously with the formation of the conductive plug 53a which connects the aluminum alloy layer for wiring for the electronic circuit with the semiconductor element included in the electronic circuit (FIG. 3A).

(2) Next, the aluminum alloy layers 11b and 61b are formed simultaneously with the formation of the aluminum alloy layer 51b for wiring for the electronic circuit. It is desirable that a titanium nitride film or the like is formed on the lower and upper surfaces of the aluminum alloy layers 11b and 61b. Next, the silicon oxide layer 12b is formed on the silicon oxide layer 12a and the aluminum alloy layers 11b and 61b. The silicon oxide layer 12b is formed simultaneously with the formation of the silicon oxide layer 52b on the aluminum alloy layer 51b for wiring for the electronic circuit.

Figure 3B:
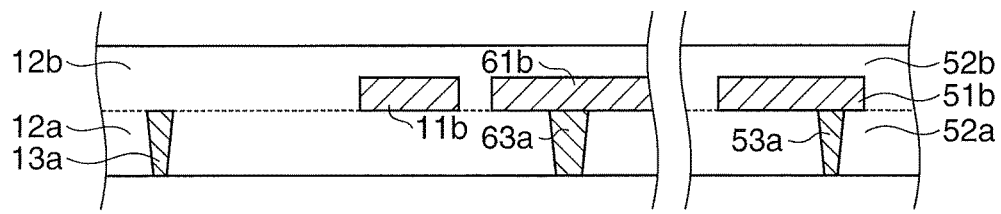

Next, the silicon oxide layer 12b is planarized by a CMP method (FIG. 3B). In this case, the aluminum alloy layer 51b is located above the region in which the electronic circuit is formed, and in addition, the aluminum alloy layers 11b and 61b are also located above the periphery of the region in which the light receiving element 30 is formed. With this configuration, it is possible to prevent the silicon oxide layer 12b above the region in which the light receiving element 30 is formed from being excessively removed to deteriorate the planarity (CMP dishing). For preventing the CMP dishing described above, it is desirable that the length of one piece of the aluminum alloy layers 11b and 61b is set to, for example, 300 μm or less, and that the sum of the widths of the aluminum alloy layers 11b and 61b is set to, for example, 6 μm or more.

Figure 3C:
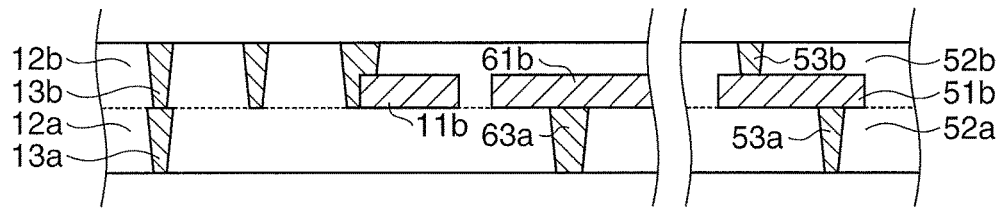

(3) Next, a portion of the silicon oxide layer 12b is etched to thereby form a groove in the silicon oxide layer 12b. Next, the tungsten layer 13b is embedded in the groove formed in the silicon oxide layer 12b (FIG. 3C). The tungsten layer 13b is formed simultaneously with the formation of the conductive plug 53b which connects the aluminum alloy layers 51b and 51c for wiring for the electronic circuit.

Figure 3D:
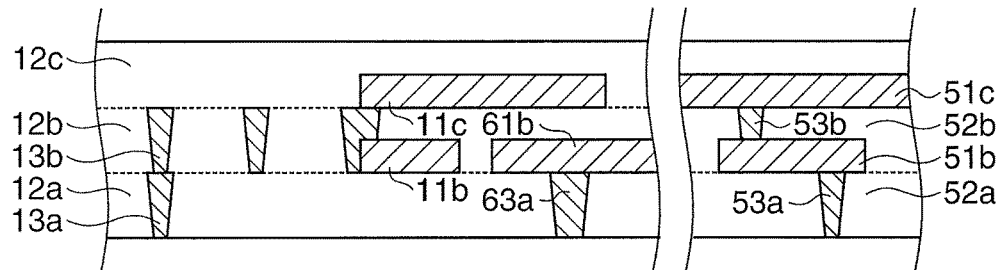
Figure 3E:
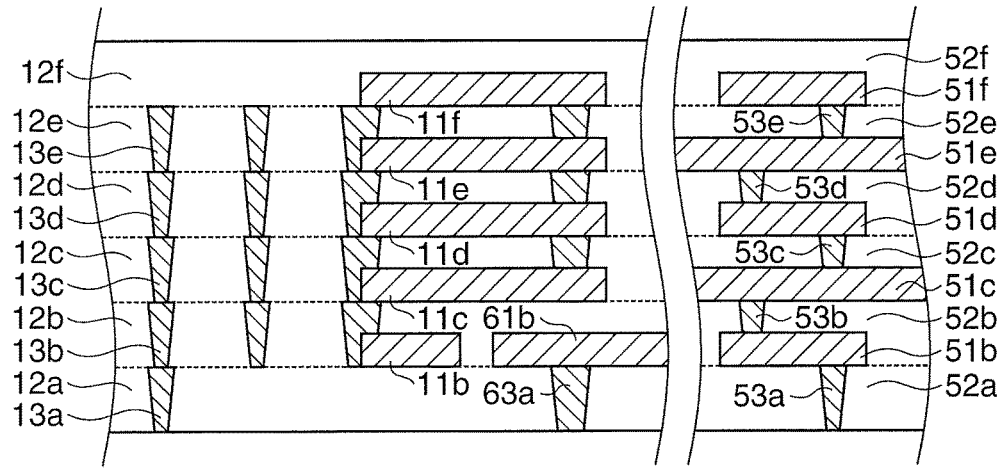

The processes (2) and (3) described above are repeated a predetermined number of times to thereby form the angle limiting filter 10 (FIGS. 3D and 3E).

Not only in the above-described process of planarizing the silicon oxide layer 12b, but also in the process of planarizing the silicon oxide layers 12c to 12f, the aluminum alloy layers 11c to 11f are located above the periphery of the region in which the light receiving element 30 is formed. With this configuration, it is possible to prevent the silicon oxide layers 12c to 12f above the region in which the light receiving element 30 is formed from being excessively removed to deteriorate the planarity (CMP dishing). For preventing the CMP dishing described above, it is desirable that the length of one piece of the aluminum alloy layers 11c to 11f is set to, for example, 300 μm or less, and that the width of the aluminum alloy layers 11c to 11f is set to, for example, 6 μm or more.

Next, the wavelength limiting filter 20 is formed on the angle limiting filter 10 (refer to FIG. 2). For example, a silicon oxide layer is first formed on the angle limiting filter 10, and the silicon oxide layer is processed by a CMP method or the like into the inclined structure 23 at a predetermined angle. Next, a number of the low refractive index thin films 21 and a number of the high refractive index thin films 22 are alternately stacked.

Through the processes described above, the spectroscopic sensor 1 is manufactured.

2. Second Embodiment

Figure 4:
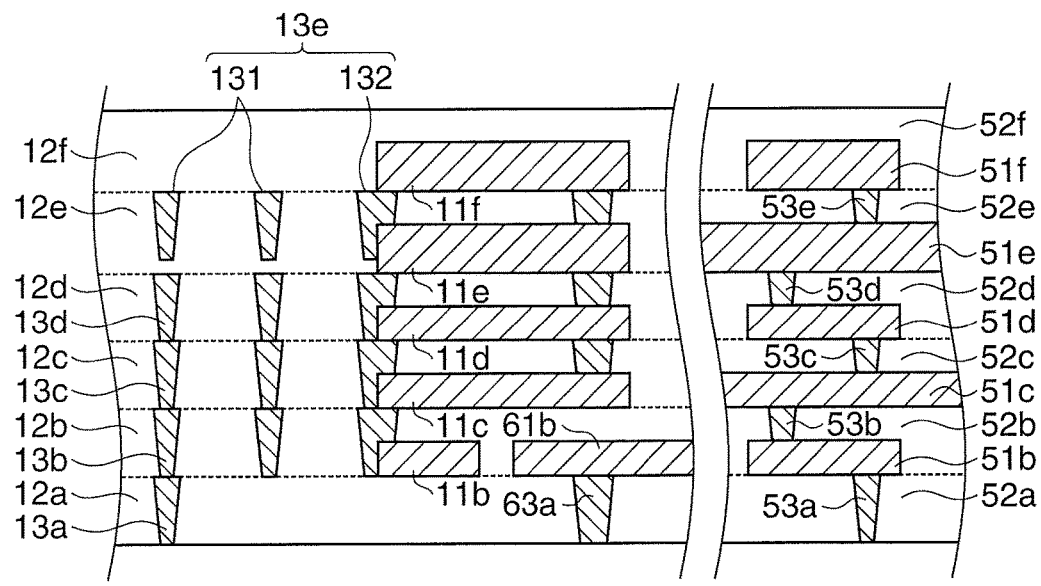
FIG. 4 is a cross-sectional view partially showing an angle limiting filter and wiring layers according to a second embodiment.

FIG. 4 is a cross-sectional view partially showing an angle limiting filter and wiring layers according to a second embodiment of the invention.

In the second embodiment, the thickness of the aluminum alloy layer 11e (and 11f) is greater compared to that of the aluminum alloy layers 11b to 11d. In such a case, for connecting the tungsten layer 13e with the tungsten layer 13d below the tungsten layer 13e when a groove is formed in the silicon oxide layer 12e to embed the tungsten layer 13e into the groove, it is necessary to make the groove formed in the silicon oxide layer 12e deep. However, if the etching time for the silicon oxide layers 12e and 52e is extended when the formation of groove in the silicon oxide layer 12e and the formation of groove in the silicon oxide layer 52e are performed in a common process, a titanium nitride (TiN) film on a surface of the aluminum alloy layer 51e is etched. Therefore, an electrical resistance between the aluminum alloy layer 51e and the conductive plug 53e is sometimes increased.

In the second embodiment, therefore, the depth of the groove formed in the silicon oxide layer 12e is equal to that of the groove formed in the other silicon oxide layers 12b to 12d, whereby a gap is formed between the tungsten layer 13e and the tungsten layer 13d.

On the other hand, when the tungsten layers 13a to 13d are connected to the light receiving element 30 to be used as a portion of an electric circuit, a stray capacitance may be generated due to the gap between the tungsten layer 13e and the tungsten layer 13d. For preventing this, in the second embodiment, an inner edge surface of the aluminum alloy layer 11e is located at the center of the width of the outer portion 132 of the tungsten layer 13e and the tungsten layer 13d so that the aluminum alloy layer 11e is connected to both the tungsten layer 13e and the tungsten layer 13d.

The other points are similar to the first embodiment.

3. Third Embodiment

Figure 5:
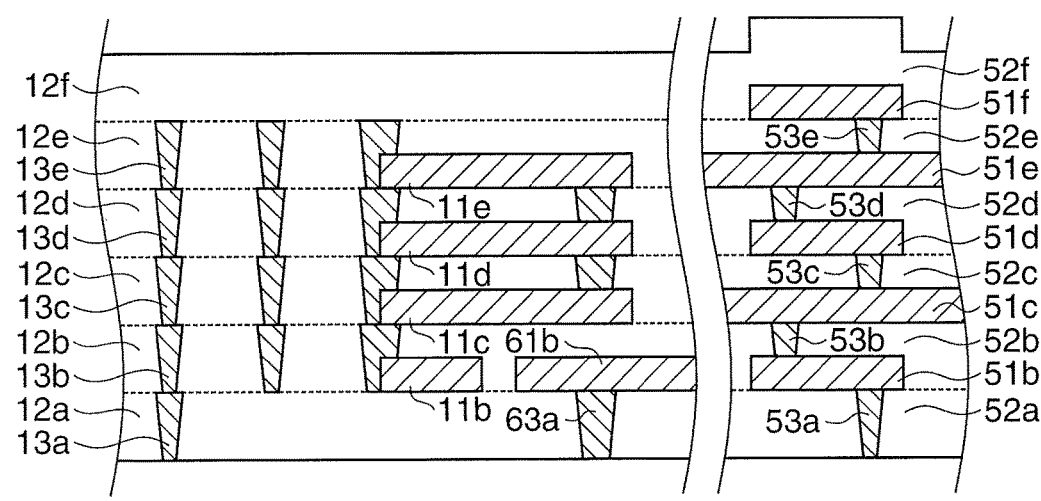
FIG. 5 is a cross-sectional view partially showing an angle limiting filter and wiring layers according to a third embodiment.

FIG. 5 is a cross-sectional view partially showing an angle limiting filter and wiring layers according to a third embodiment of the invention.

In the third embodiment, an aluminum alloy layer is not formed on the silicon oxide layer 12e and the uppermost tungsten layer 13e. In the first embodiment, since the aluminum alloy layer 11f is formed on the silicon oxide layer 12e and the tungsten layer 13e, and the silicon oxide layer 12f is further formed on the aluminum alloy layer 11f, it is necessary to planarize the silicon oxide layer 12f after depositing the silicon oxide layer 12f. In contrast to this, in the third embodiment, since an aluminum alloy layer is not formed on the silicon oxide layer 12e and the uppermost tungsten layer 13e, but the silicon oxide layer 12f is formed thereon, the silicon oxide layer 12f is evenly formed only by depositing the silicon oxide layer 12f. Accordingly, in the third embodiment, the process of planarizing the silicon oxide layer 12f can be omitted.

The other points are similar to the first and second embodiments.

4. Fourth Embodiment

Figure 6:
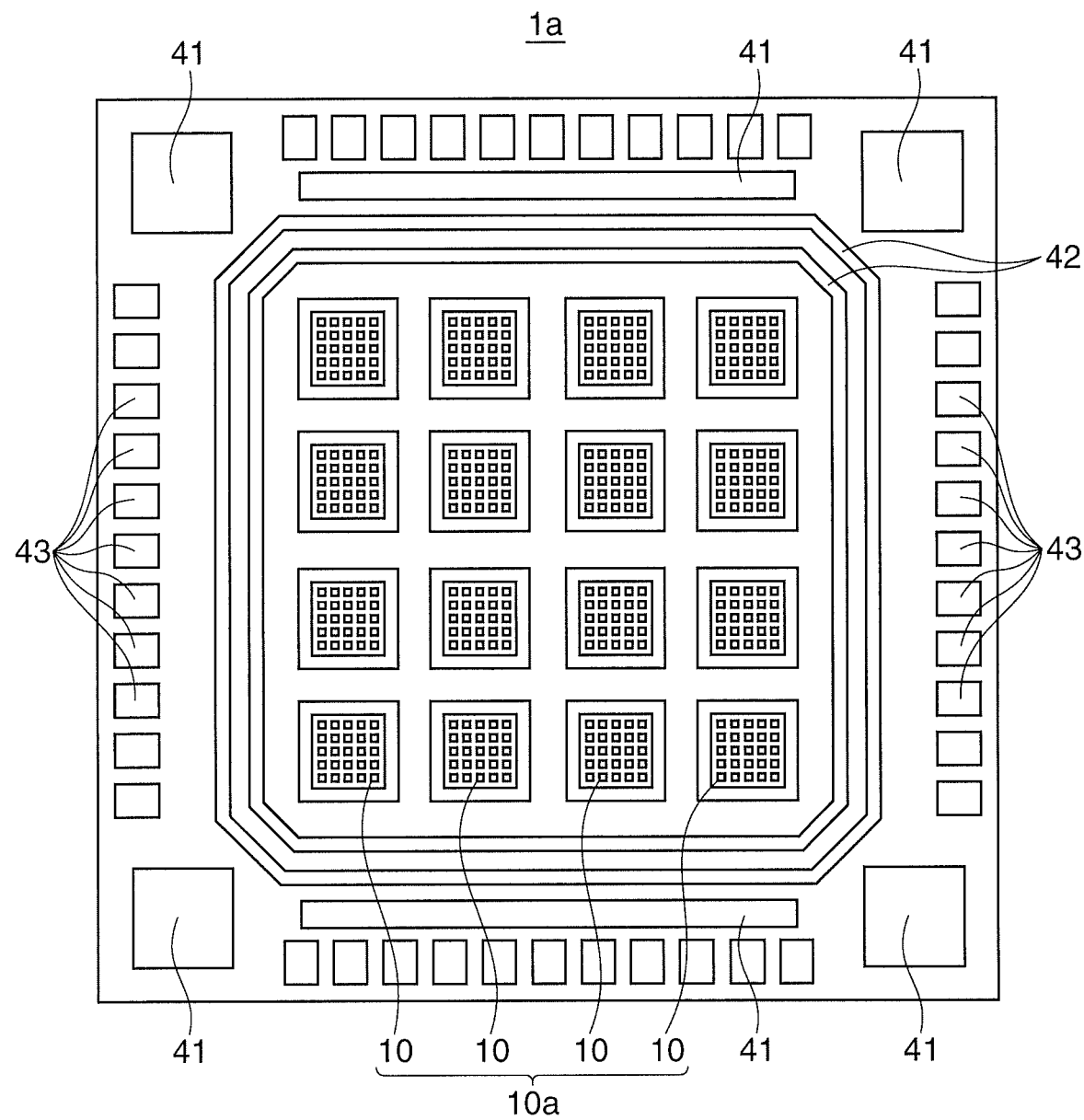
FIG. 6 is a plan view showing an angle limiting filter and a spectroscopic sensor according to a fourth embodiment.

FIG. 6 is a plan view showing an angle limiting filter and a spectroscopic sensor according to a fourth embodiment of the invention. In FIG. 6, other than the angle limiting filters 10, electronic circuits 41 including semiconductor elements, power wires 42, and pad electrodes 43 are also shown.

The spectroscopic sensor 1a in the fourth embodiment includes a large-area angle limiting filter 10a having a plurality of angle limiting filters 10 arranged on a semiconductor chip and each having the aluminum alloy layers 11b to 11e arranged at the edge portion thereof in the first embodiment. Since the angle limiting filter 10a has the angle limiting filter 10 having the aluminum alloy layers 11b to 11e arranged at the edge portion thereof, the angle limiting filter 10a having high planarity can be provided.

The other points are similar to the first embodiment.

5. Fifth Embodiment

Figure 7A:
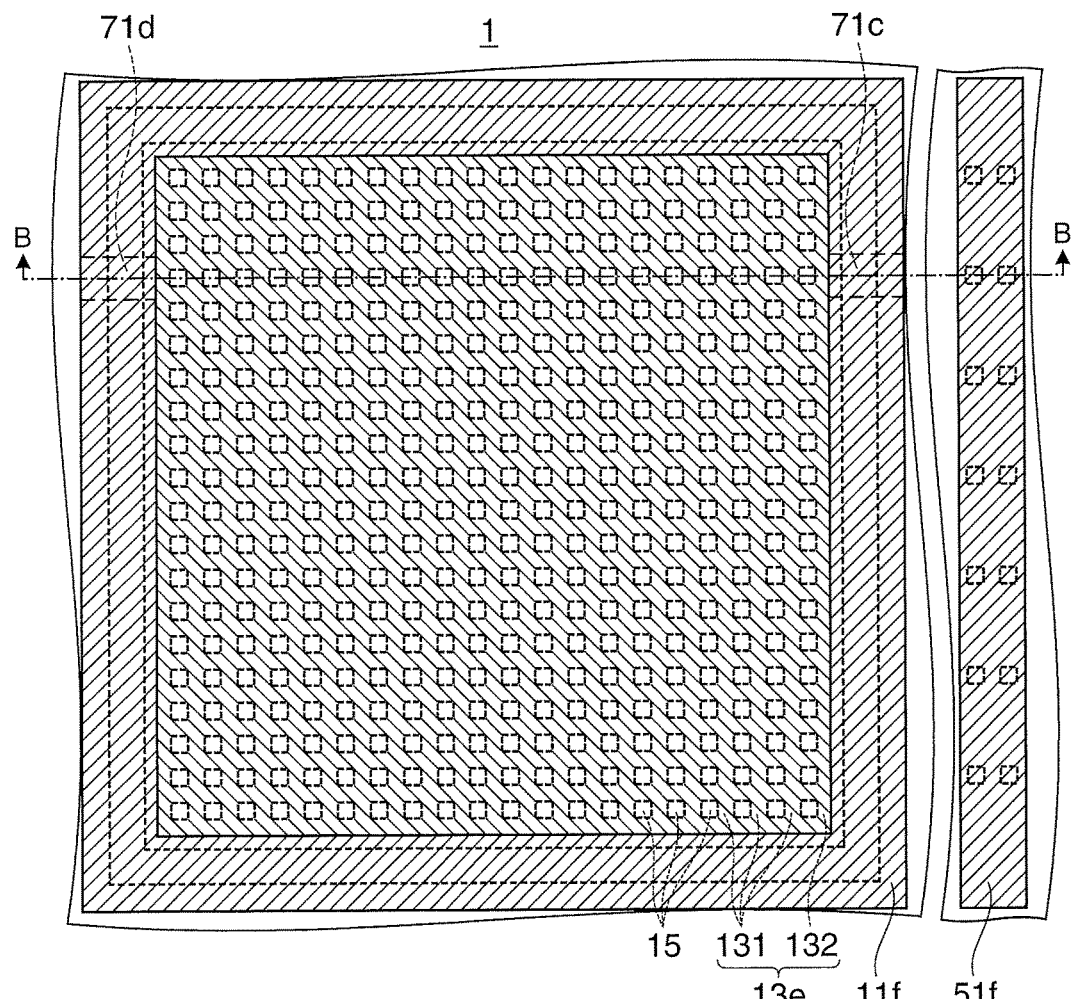
FIGS. 7A and 7B show an angle limiting filter and a spectroscopic sensor according to a fifth embodiment.
Figure 7B:
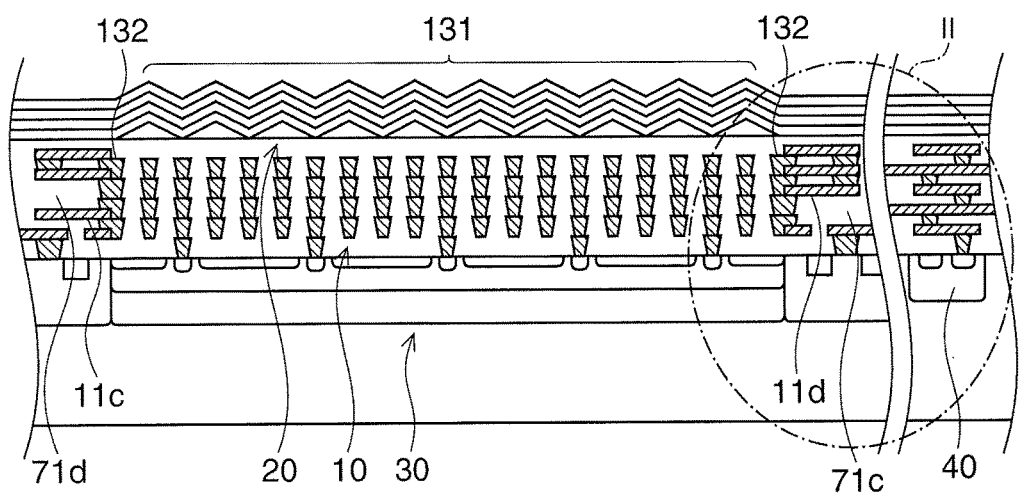
Figure 8:
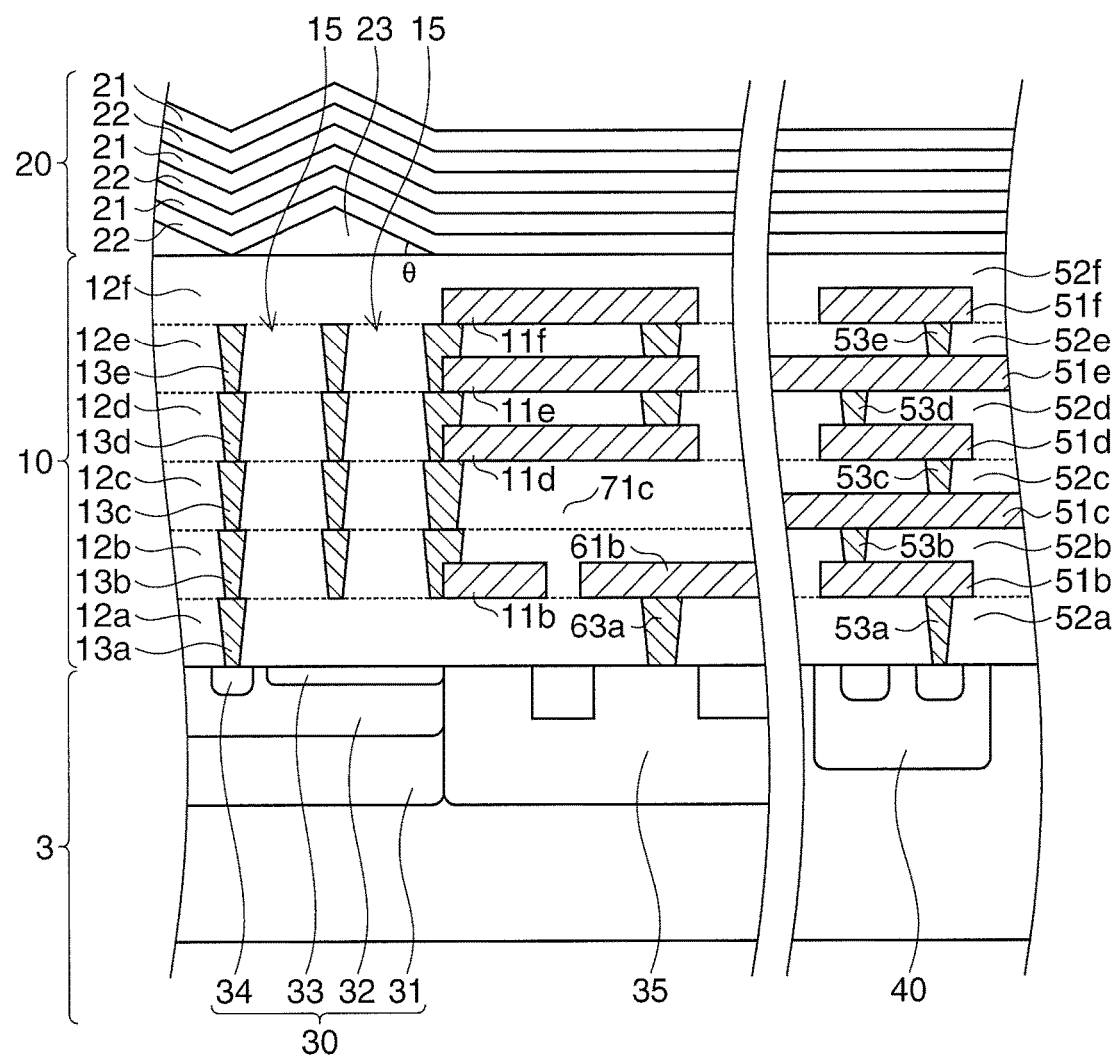
FIG. 8 is a cross-sectional view showing the angle limiting filter and the spectroscopic sensor according to the fifth embodiment.
Figure 9A:
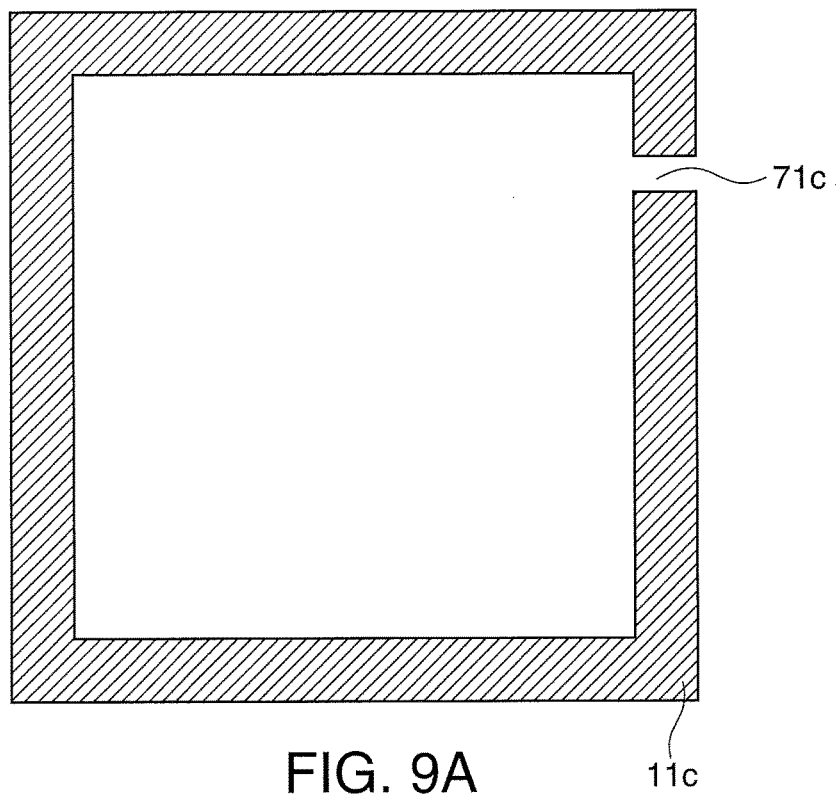
FIGS. 9A and 9B are plan views each showing a wiring layer according to the fifth embodiment.
Figure 9B:
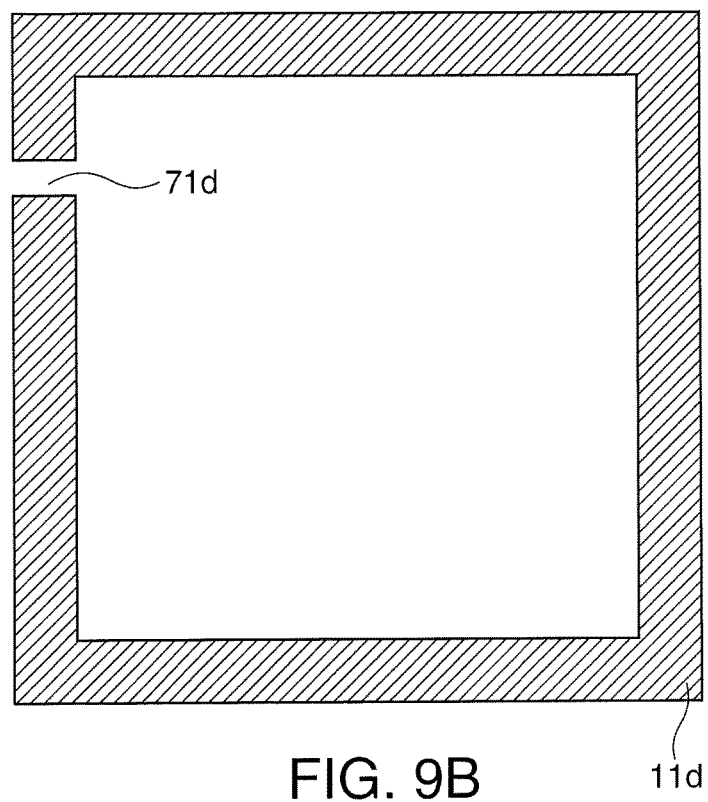

FIGS. 7A and 7B are schematic views showing an angle limiting filter and a spectroscopic sensor according to a fifth embodiment of the invention. FIG. 7A is a plan view of the spectroscopic sensor. FIG. 7B is a cross-sectional view taken along line B-B of FIG. 7A. FIG. 8 corresponds to an enlarged view of a portion of surrounding line II shown in FIG. 7B. FIG. 9A is a plan view of the aluminum alloy layer 11c. FIG. 9B is a plan view of the aluminum alloy layer 11d. In FIG. 7A, the wavelength limiting filter 20 is omitted.

In the fifth embodiment, a gap 71c and a gap 71d are formed in the aluminum alloy layer 11c and the aluminum alloy layer 11d, respectively (refer to FIGS. 9A and 9B). Accordingly, the aluminum alloy layer 11c and the aluminum alloy layer 11d are absent in the gap 71c and the gap 71d, respectively (refer to FIG. 7B). That is, the aluminum alloy layer 11c may not entirely surround the tungsten layer 13c, and may surround at least one portion thereof with the gap 71c disposed therein. Similarly, the aluminum alloy layer 11d may not entirely surround the tungsten layer 13d, and may surround at least one portion thereof with the gap 71d disposed therein. A gap may be formed in the other aluminum alloy layers 11b, 11e, and 11f.

A plurality of gaps 71c and a plurality of gaps 71d may be formed in the aluminum alloy layers 11c and 11d, respectively. The gap may be several tens micrometers. That is, it is sufficient that the deterioration of the planarity (CMP dishing) caused by the excessive removal of the silicon oxide layers 12c and 12d above the region in which the light receiving element 30 is formed falls within an allowable range. When a plurality of gaps 71c are formed in the aluminum alloy layer 11c, it is further preferable that the plurality of gaps 71c have, in plan view, a symmetrical arrangement about the center of a region surrounded by the aluminum alloy layer 11c. With this configuration, the planarity of the region surrounded by the aluminum alloy layer 11c is improved.

It is preferable that the gap 71c overlaps the aluminum alloy layer 11d in plan view. It is preferable that the gap 71d overlaps the aluminum alloy layer 11c in plan view. With this configuration, it is possible to prevent incident light from the gaps 71c and 71d from reaching the light receiving element 30.

The other points are similar to the first embodiment.

The angle limiting filters according to the second and third embodiments described above can also be applied to the spectroscopic sensor according to the first embodiment, the spectroscopic sensor according to the fourth embodiment, and the spectroscopic sensor according to the fifth embodiment.

What is claimed is:

1. An angle limiting filter comprising:
a first light-shielding layer containing a first light-shielding material and provided with a plurality of first openings;
a second light-shielding layer containing a second light-shielding material and located in a region which surrounds at least one portion of the first light-shielding layer, wherein
the first light-shielding layer contacts two edges and a corner of an edge surface of the second light-shielding layer, the two edges intersecting each other to form the corner,
the first light-shielding layer includes a first portion located between two of the first openings next to each other and a second portion located closer to the side of the second light-shielding layer than the first portion and the plurality of first openings, and
the edge surface, which includes the two edges intersecting each other to form the corner, of the second light-shielding layer is located at the center of the width of the second portion of the first light-shielding layer.

2. The angle limiting filter according to claim 1, wherein the reflectance of the first light-shielding material is lower than that of the second light-shielding material.

3. The angle limiting filter according to claim 1, wherein the first light-shielding layer is configured with a material whose reflectance is lower than that of aluminum.

4. A spectroscopic sensor comprising:
the angle limiting filter according to claim 1;
a wavelength limiting filter which limits the wavelength of light capable of passing through the angle limiting filter; and
a light receiving element which detects light passed through the angle limiting filter and the wavelength limiting filter.

5. The angle limiting filter according to claim 3, wherein a width of the second portion is wider than a width of the first portion.

6. The angle limiting filter according to claim 1, wherein the first light-shielding layer is constituted by one of tungsten, titanium nitride, titanium tungsten, titanium, tantalum, tantalum nitride, chromium, or molybdenum.

7. The angle limiting filter according to claim 1, wherein the second light-shielding layer is constituted by aluminum alloy or copper alloy.

8. A plurality of the angle limiting filters according to claim 1, wherein
the plurality of the angle limiting filters are arranged on a semiconductor chip.

* * * * *